(12) United States Patent
Wang (10) Patent No.: US 12,376,475 B2
(45) Date of Patent: Jul. 29, 2025

(54) DISPLAY PANEL AND METHOD FOR REPAIRING THE SAME

(71) Applicant: SHENZHEN CHINA STAR OPTOELECTRONICS SEMICONDUCTOR DISPLAY TECHNOLOGY CO., LTD., Guangdong (CN)

(72) Inventor: Ruonan Wang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/756,047

(22) PCT Filed: Mar. 15, 2022

(86) PCT No.: PCT/CN2022/080866
§ 371 (c)(1),
(2) Date: May 14, 2022

(87) PCT Pub. No.: WO2023/164977
PCT Pub. Date: Sep. 7, 2023

(65) Prior Publication Data
US 2024/0155911 A1     May 9, 2024

(30) Foreign Application Priority Data
Mar. 2, 2022 (CN) .................. 202210196798.6

(51) Int. Cl.
*H10K 59/80* (2023.01)
*H10K 59/12* (2023.01)
*H10K 59/124* (2023.01)

(52) U.S. Cl.
CPC ... *H10K 59/80516* (2023.02); *H10K 59/1201* (2023.02); *H10K 59/124* (2023.02)

(58) Field of Classification Search
CPC ... H10K 50/814; H10K 71/861; H10K 59/131
See application file for complete search history.

(56) References Cited

U.S. PATENT DOCUMENTS

2016/0189593 A1*   6/2016   Lee .................. G09G 3/3233
                                                             438/4
2020/0013992 A1*   1/2020   Cheng ................ H10K 50/81
(Continued)

FOREIGN PATENT DOCUMENTS

CN     104659058 A     5/2015
CN     206834178 U     1/2018
(Continued)

OTHER PUBLICATIONS

International Search Report in International application No. PCT/CN2022/080866, mailed on Jul. 27, 2022.
(Continued)

*Primary Examiner* — Evren Seven
(74) *Attorney, Agent, or Firm* — PV IP PC; Wei Te Chung (57) ABSTRACT

The present disclosure discloses a display panel and a method for repairing the same. The display panel includes a plurality of subpixels, each of the plurality of subpixels including an active layer, a source, an anode, and a repair electrode disposed on a substrate, wherein the source is located between the active layer and the anode, and the repair electrode is connected to the source and located on a side of the active layer close to the anode; with respect to two adjacent subpixels, an orthographic projection of the repair electrode of one subpixel of the two adjacent subpixels on the substrate partially overlaps with an orthographic (Continued)

projection of the anode of the other subpixel of the two adjacent subpixels on the substrate.

18 Claims, 6 Drawing Sheets

(56) References Cited

U.S. PATENT DOCUMENTS

| 2020/0066817 A1* | 2/2020 | Kim | H10K 59/8051 |
| 2020/0212131 A1* | 7/2020 | Kim | H10K 59/1315 |
| 2022/0020947 A1* | 1/2022 | Park | H10K 59/123 |
| 2022/0190096 A1* | 6/2022 | Park | H10K 59/131 |

FOREIGN PATENT DOCUMENTS

| CN | 207134356 U | 3/2018 |
| CN | 110165058 A | 8/2019 |
| CN | 110568678 A | 12/2019 |
| CN | 110797351 A | 2/2020 |
| CN | 110890401 A | 3/2020 |
| KR | 20160025327 A | 3/2016 |

OTHER PUBLICATIONS

Written Opinion of the International Search Authority in International application No. PCT/CN2022/080866, mailed on Jul. 27, 2022.

Chinese Office Action issued in corresponding Chinese Patent Application No. 202210196798.6 dated Sep. 28, 2024, pp. 1-8.

* cited by examiner

DISPLAY PANEL AND METHOD FOR REPAIRING THE SAME

TECHNICAL FIELD

The present disclosure relates to a display technology field, and in particular, to a display panel and a method for repairing the same.

BACKGROUND

In a manufacturing process of an organic light-emitting diode (OLED) display panel, under the influence of a manufacturing process or an external environment, there are some residues such as metal chips or foreign matters in a thin film transistor, so that a subpixel driven by the thin film transistor becomes a dark spot subpixel. When the number of the dark spot subpixels exceeds a certain number, the panel is discarded, thereby reducing a manufacturing yield of the display panel.

Technical Problems

Embodiments of the present disclosure provide a display panel and a method for repairing the same, which may repair a dark spot subpixel when the dark spot subpixel is present, so as to improve a manufacturing yield of the display panel.

Technical Solutions to the Problem

The present disclosure provides a display panel. The display panel includes a plurality of subpixels, each of the plurality of subpixels including an active layer, a source, an anode, and a repair electrode disposed on a substrate, wherein the source is located between the active layer and the anode, and the repair electrode is connected to the source and located on a side of the active layer close to the anode;

wherein with respect to two adjacent subpixels, an orthographic projection of the repair electrode of one subpixel of the two adjacent subpixels on the substrate partially overlaps with an orthographic projection of the anode of the other subpixel of the two adjacent subpixels on the substrate, and the repair electrode of the one subpixel is insulated from the anode of the other subpixel.

Alternatively, in some embodiments of the present disclosure, the anode has an extension portion, wherein in a direction parallel to a plane on which the substrate is located, with respect to the two adjacent subpixels, the repair electrode of the one subpixel extends toward the extension portion of the other subpixel, the extension portion of the other subpixel extends toward the repair electrode of the one subpixel, and the orthographic projection of the repair electrode of the one subpixel on the substrate partially overlaps with an orthographic projection of the extension portion of the other subpixel on the substrate.

Alternatively, in some embodiments of the present disclosure, with respect to the two adjacent subpixels, the repair electrode of the one subpixel is disposed in the same layer as the source, and extends from one end of the source toward the extending portion of the other subpixel.

Alternatively, in some embodiments of the present disclosure, the display panel further includes a passivation layer, a protection electrode, and a planarization layer sequentially disposed between the source and the anode, wherein a contact hole is formed in the passivation layer, the protection electrode is connected to the source through the contact hole, a via hole communicating with the contact hole is formed in the planarization layer, and the anode is connected to the protection electrode through the via hole;

wherein an orthographic projection of the protection electrode on the plane in which the substrate is located at least partially overlaps with the orthographic projection of the repair electrode on the plane in which the substrate is located.

Alternatively, in some embodiments of the present disclosure, a connection hole spaced apart from the contact hole is further disposed in the passivation layer, the connection hole is located in an overlapping area of the orthographic projection of the protection electrode on the substrate and the orthographic projection of the repair electrode on the substrate, and the protection electrode is connected to the repair electrode through the connection hole.

Alternatively, in some embodiments of the present disclosure, the display panel further includes a passivation layer, an auxiliary repair electrode, and a planarization layer sequentially disposed between the source and the anode, wherein an orthographic projection of the auxiliary repair electrode on the plane in which the substrate is located at least partially overlaps with the orthographic projection of the repair electrode on the plane in which the substrate is located, a connection hole is formed in the passivation layer, and the auxiliary repair electrode is connected to the repair electrode through the connection hole.

Alternatively, in some embodiments of the present disclosure, the display panel further includes a protection electrode disposed between the passivation layer and the planarization layer, a contact hole spaced apart from the connection hole is further formed in the passivation layer, the protection electrode is connected to the source through the contact hole, a via hole communicating with the contact hole is formed in the planarization layer, and the anode is connected to the protection electrode through the via hole;

wherein the auxiliary repair electrode is arranged in the same layer as the protection electrode and spaced apart from the protection electrode.

Alternatively, in some embodiments of the present disclosure, the display panel further includes a passivation layer, a protection electrode, and a planarization layer sequentially disposed between the source and the anode, wherein a contact hole is formed in the passivation layer, the protection electrode is connected to the source through the contact hole, a via hole communicating with the contact hole is formed in the planarization layer, and the anode is connected to the protection electrode through the via hole;

wherein with respect to the two adjacent subpixels, the repair electrode of the one subpixel is disposed in the same layer as the protection electrode and extends from one end of the protection electrode toward the extending portion of the other subpixel.

Alternatively, in some embodiments of the present disclosure, the display panel further includes an auxiliary repair electrode, the auxiliary repair electrode is arranged in the same layer as the source and spaced apart from the source, an orthographic projection of the auxiliary repair electrode on the plane in which the substrate is located at least partially overlaps with the orthographic projection of the repair electrode on the plane in which the substrate is located, a connection hole spaced apart from the contact hole is formed in the passivation layer, and the auxiliary repair electrode is connected to the repair electrode through the connection hole.

Alternatively, in some embodiments of the present disclosure, light emitting by the two adjacent subpixels has a same color.

The present disclosure further provides a method for repairing a display panel according to any of the foregoing embodiments, including the following steps:

detecting whether or not there is a dark spot subpixel in the plurality of subpixels, and if there is a dark spot subpixel, welding the repair electrode in the dark spot subpixel to the extension of the anode in an adjacent normal subpixel.

The present disclosure further provides a display panel, wherein the display panel includes a plurality of subpixels, each of the plurality of subpixels includes an active layer, a source, an anode, and a repair electrode disposed on a substrate; the source is located between the active layer and the anode, and the repair electrode is connected to the source and located on a side of the active layer close to the anode;

wherein with respect to two adjacent subpixels, an orthographic projection of the repair electrode of one subpixel of the two adjacent subpixels on the substrate partially overlaps with an orthographic projection of the anode of the other subpixel of the two adjacent subpixels on the substrate, and the repair electrode of the one subpixel is connected to the anode of the other subpixel.

Alternatively, in some embodiments of the present disclosure, the anode has an extension portion, wherein in a direction parallel to a plane in which the substrate is located; with respect to the two adjacent subpixels, the repair electrode of the one subpixel extends toward the extension portion of the other subpixel, the extension portion of the other subpixel extends toward the repair electrode of the one subpixel, and the orthographic projection of the repair electrode of the one subpixel on the substrate partially overlaps with an orthographic projection of the extension portion of the other subpixel on the substrate.

Alternatively, in some embodiments of the present disclosure, with respect to the two adjacent subpixels, the repair electrode of the one subpixel is disposed in the same layer as the source, and extends from one end of the source toward the extending portion of the other subpixel.

Alternatively, in some embodiments of the present disclosure, the display panel further includes a passivation layer, a protection electrode, and a planarization layer sequentially disposed between the source and the anode, wherein a contact hole is formed in the passivation layer, the protection electrode is connected to the source through the contact hole, a via hole communicating with the contact hole is formed in the planarization layer, and the anode is connected to the protection electrode through the via hole;

wherein an orthographic projection of the protection electrode on the plane in which the substrate is located at least partially overlaps with the orthographic projection of the repair electrode on the plane in which the substrate is located.

Alternatively, in some embodiments of the present disclosure, a connection hole spaced apart from the contact hole is further disposed in the passivation layer, the connection hole is located in an overlapping area of the orthographic projection of the protection electrode on the substrate and the orthographic projection of the repair electrode on the substrate, and the protection electrode is connected to the repair electrode through the connection hole.

Alternatively, in some embodiments of the present disclosure, the display panel further includes a passivation layer, an auxiliary repair electrode, and a planarization layer sequentially disposed between the source and the anode, wherein an orthographic projection of the auxiliary repair electrode on the plane in which the substrate is located at least partially overlaps with the orthographic projection of the repair electrode on the plane in which the substrate is located, a connection hole is formed in the passivation layer, and the auxiliary repair electrode is connected to the repair electrode through the connection hole.

Alternatively, in some embodiments of the present disclosure, the display panel further includes a protection electrode disposed between the passivation layer and the planarization layer, a contact hole spaced apart from the connection hole is further formed in the passivation layer, the protection electrode is connected to the source through the contact hole, a via hole communicating with the contact hole is formed in the planarization layer, and the anode is connected to the protection electrode through the via hole;

wherein the auxiliary repair electrode is arranged in the same layer as the protection electrode and spaced apart from the protection electrode.

Alternatively, in some embodiments of the present disclosure, the display panel further includes a passivation layer, a protection electrode, and a planarization layer sequentially disposed between the source and the anode, wherein a contact hole is formed in the passivation layer, the protection electrode is connected to the source through the contact hole, a via hole communicating with the contact hole is formed in the planarization layer, and the anode is connected to the protection electrode through the via hole;

wherein with respect to the two adjacent subpixels, the repair electrode of the one subpixel is disposed in the same layer as the protection electrode and extends from one end of the protection electrode toward the extending portion of the other subpixel.

Alternatively, in some embodiments of the present disclosure, light emitting by the two adjacent subpixels has a same color.

Beneficial Effects

In contrast to a display panel in the prior art, a display panel according to the present disclosure is disposed with a repair electrode in each subpixel. With respect to two adjacent subpixels, an orthographic projection of a repair electrode of one subpixel on a substrate partially overlaps with an orthographic projection of an anode of the other subpixel on the substrate. When a dark spot subpixel is present in the display panel, a repair electrode in the dark spot subpixel and an anode in an adjacent normal subpixel are welded, so that the dark spot subpixel can be driven by the anode in the adjacent subpixel to emit light, and thus the dark spot subpixel can be repaired as a normal subpixel, thereby improving a manufacturing yield of the display panel.

BRIEF DESCRIPTION OF THE DRAWINGS

In order to more clearly illustrate the technical solutions in embodiments of the present disclosure, the accompanying drawings to be used in the description of the embodiments will be briefly described below. It will be apparent that the accompanying drawings in the following description are merely some embodiments of the present disclosure, and other drawings may be obtained from these drawings without creative effort by those skilled in the art.

EMBODIMENTS OF THE PRESENT DISCLOSURE

Technical solutions in embodiments of the present disclosure will be clearly and completely described below with reference to the accompanying drawings in the embodiments of the present disclosure. It is apparent that described embodiments are only a part of the embodiments of the present disclosure and not all of the embodiments. Based on the embodiments of present disclosure, all other embodiments obtained by those skilled in the art without creative efforts fall within the scope of present disclosure. Furthermore, it should be understood that the particular embodiments described herein are merely for illustrating and interpreting the present disclosure and are not intended to limit present disclosure. Unless otherwise stated, the use of directional words such as "upper" and "lower" generally refers to upper and lower in the actual use or working state of the device, and in particular to, the direction of drawing in the accompanying drawings; and "inside" and "outer" refer to the outline of the device.

The present disclosure provides a display panel, a method for repairing the same, and a display device. Detailed description will be given below. It should be noted that, in the display panel of the present disclosure, a source and a drain of a thin film transistor are interchangeable. In the present disclosure, in order to distinguish between two electrodes of the thin film transistor except for a gate, one of the two electrodes is referred to as a source and the other electrode is referred to as a drain.

The present disclosure provides a display panel including a plurality of subpixels, each of which including an active layer, a source, an anode, and a repair electrode disposed on a substrate, wherein the source is located between the active layer and the anode, and the repair electrode is connected to the source and located on a side of the active layer close to the anode, and wherein with respect to two adjacent subpixels, an orthographic projection of the repair electrode of one subpixel of the two adjacent subpixels on the substrate partially overlaps with an orthographic projection of the anode of the other subpixel of the two adjacent subpixels on the substrate, and the repair electrode of the one subpixel is insulated from the anode of the other subpixel.

Therefore, a display panel according to the present disclosure is disposed with a repair electrode in each subpixel. With respect to two adjacent subpixels, an orthographic projection of a repair electrode of one subpixel on a substrate partially overlaps with an orthographic projection of an anode of the other subpixel on the substrate. When a dark spot subpixel is present in the display panel, a repair electrode in the dark spot subpixel and an anode in an adjacent normal subpixel are welded and connected, so that the dark spot subpixel may be driven by the anode in the adjacent normal subpixel to emit light, and thus the dark spot subpixel may be repaired as a normal subpixel, thereby improving a manufacturing yield of the display panel.

It should be noted that, in the present disclosure, different from "dark spot subpixel", the "normal subpixel" refers to a subpixel that can normally emit light when driven by the thin film transistor.

The display panel according to the present disclosure is described in detail below by specific embodiments. It should be noted that the order of description of the following embodiments is not a limitation on the preferred order of the embodiments.

Figure 1:
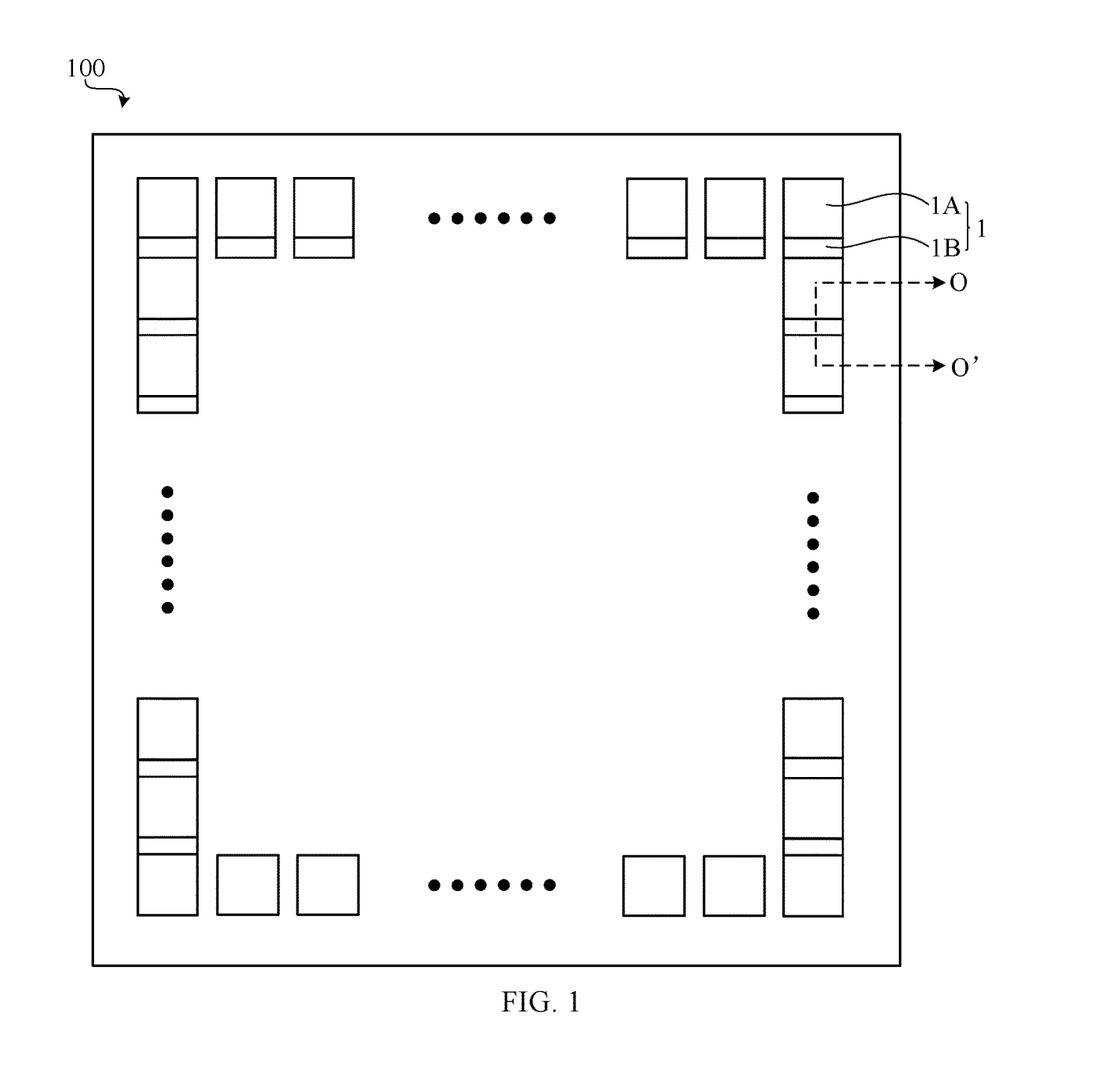
FIG. 1 is a plan schematic view of a display panel according to the present disclosure.
Figure 2:
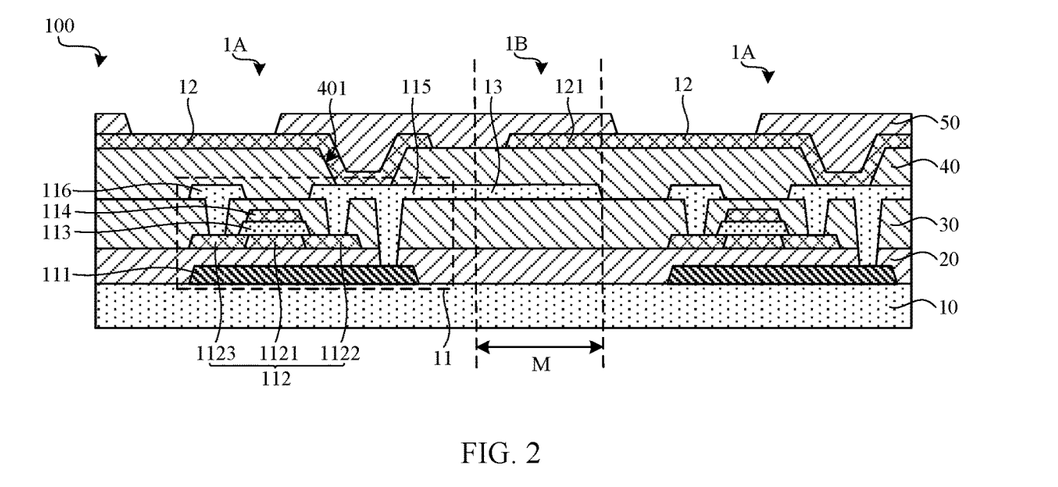
FIG. 2 is a first structural schematic view taken along section line O-O' of the display panel shown in FIG. 1.

Referring to FIGS. 1 and 2, a first embodiment of the present disclosure provides a display panel 100. The display panel 100 includes a plurality of subpixels 1. Each subpixel 1 includes a thin film transistor 11, an anode 12, and a repair electrode 13 disposed on a substrate 10. The thin film transistor 11 includes a light shielding portion 111, an active layer 112, a gate insulating layer 113, a gate 114, a source 115, and a drain 116. The source 115 is connected to the anode 12. The repair electrode 13 is connected to the source 115.

In this embodiment, each subpixel 1 has a light-emitting area 1A and a repair region 1B located on one side of the light-emitting area 1A. Here, in a same subpixel 1, both the thin film transistor 11 and the anode 12 are located in the light-emitting area 1A. The repair electrode 13 is located in the repair region 1B. With respect to two adjacent subpixels 1, the repair region 1B of one subpixel 1 is adjacent to the light-emitting area 1A of the other subpixel 1, and the light-emitting area 1A of the other subpixel 1 has an overlapping area M with the repair region 1B of the one subpixel 1, as shown in FIG. 2. The repair region 1B is an area in which dark spot subpixel is repaired when the dark spot subpixel is present in the display panel 100.

Further, in this embodiment, the display panel 100 further includes a buffer layer 20, an interlayer insulating layer 30, a planarization layer 40, and a pixel definition layer 50. The buffer layer 20, the interlayer insulating layer 30, the planarization layer 40, and the pixel definition layer 50 are all disposed in the light-emitting area 1A and the repair region 1B.

The light shielding portion 111 is disposed on the substrate 10. The light shielding portion 111 may be in the form of a single-layer structure, a double-layer structure, or a multi-layer structure. In particular, a material of the light shielding portion 111 may include one or more of molybdenum, titanium, copper, and aluminum. For example, when the light shielding portion 111 is in a double-layer structure, the light shielding portion 111 may include a bottom layer of titanium as a light shielding material and a top layer of copper as a light shielding material. Alternatively, the light shielding portion 111 may include a bottom layer of molybdenum titanium alloy as a light shielding material and a top layer of copper as a light shielding material. A thickness of the light shielding portion 111 is 500 Angstroms (Å)-2000 Å, such as 500 Å, 800 Å, 1000 Å, 1200 Å, 1500 Å, 1,800 Å, or 2,000 Å, etc.

The buffer layer 20 is disposed on a side of the light shielding portion 111 away from the substrate 10. The buffer layer 20 may be in the form of a single-layer structure, a double-layer structure, or a multi-layer structure. In particular, a material of the buffer layer 20 may include one or more of silicon nitride, silicon oxide, and silicon oxynitride. For example, when the buffer layer 20 is in a double-layer structure, the buffer layer 20 may include a bottom layer of silicon oxide as a buffer material and a top layer of silicon nitride as a buffer material. A thickness of the buffer layer 20 is 1000 Å-5000 Å, such as 1000 Å, 1500 Å, 2000 Å, 2500 Å, 3000 Å, 3500 Å, 4000 Å, or 4500 Å, etc.

The active layer 112 is disposed on a side of the buffer layer 20 away from the light shielding portion 111. An orthographic projection of the active layer 112 on a plane in which the substrate 10 is located within an orthographic projection of the light shielding portion 111 on the plane in which the substrate 10 is located. The active layer 112 includes a channel 1121, and source contacts 1122 and drain contacts 1123 located on opposite sides of the channel 1121. A material of the active layer 112 may include one or more of IGZO, IGZTO, IGTO, IZTO, and IZO.

The gate insulating layer 113 is disposed on a side of the active layer 112 away from the buffer layer 20. In a direction from the source 115 toward the drain 116, a width of the gate insulating layer 113 is slightly greater than a width of the channel 1121. The gate insulating layer 113 may be in the form of a single-layer structure, a double-layer structure, or a multi-layer structure. In particular, a material of the gate insulating layer 113 may include one or more of silicon nitride, silicon oxide, and silicon oxynitride. For example, when the gate insulating layer 113 is in a double-layer structure, the gate insulating layer 113 may include a bottom layer of silicon oxide as an insulating material and a top layer of silicon nitride as an insulating material. A thickness of the gate insulating layer 113 may be 500 Å-2000 Å, such as 500 Å, 800 Å, 1000 Å, 1200 Å, 1500 Å, 1,800 Å, or 2,000 Å, etc.

The gate 114 is disposed on a side of the gate insulating layer 113 away from the active layer 112. An orthographic projection of the gate 114 on the plane in which the substrate 10 is located overlaps with an orthographic projection of the channel 1121 on the plane in which the substrate 10 is located. The gate 114 may be in the form of a single-layer structure, a double-layer structure, or a multi-layer structure. In particular, a material of the gate 114 may include one or more of molybdenum, titanium, copper, and aluminum. Alternatively, the material of the gate 114 may include an alloy consisted of at least two of the above metals. For example, when the gate 114 is in a double-layer structure, the gate 114 may include a bottom layer of molybdenum-titanium alloy as a conductive material and a top layer of copper as a conductive material. A thickness of the gate 114 is 2000 Å-8000 Å, such as 2000 Å, 3000 Å, 4000 Å, 5000 Å, 6000 Å, 7000 Å, or 8000 Å, etc.

The interlayer insulating layer 30 is disposed on a side of the gate 114 away from the gate insulating layer 113. The interlayer insulating layer 30 may be in the form of a single-layer structure, a double-layer structure, or a multi-layer structure. In particular, a material of the interlayer insulating layer 30 may include one or more of silicon nitride, silicon oxide, and silicon oxynitride. For example, when the interlayer insulating layer 30 is in a double-layer structure, the interlayer insulating layer 30 may include a bottom layer of silicon oxide as an insulating material and a top layer of silicon nitride as an insulating material. A thickness of the interlayer insulating layer 30 is 2000 Å-10000 Å, such as 2000 Å, 3000 Å, 4000 Å, 5000 Å, 6000 Å, 7000 Å, 8000 Å, 9000 Å, or 10000 Å, etc.

A source 115 and a drain 116 are disposed on a side of the interlayer insulating layer 30 away from the gate 114. The source 115 is connected to the source contact 1122 through a via (not shown). Drain 116 is connected to the drain contact 1123 through another via (not shown). Each of the source 115 and the drain 116 may be in the form of a single-layer structure, a double-layer structure, or a multi-layer structure. In particular, a material of the source 115 is same as that of the drain 116. Materials of the source 115 and the drain 116 may be selected from one or more of molybdenum, titanium, copper, and aluminum, or may be selected from an alloy consisted of at least two of the above metals. For example, when both the source 115 and the drain 116 are in a double-layer structure, both the source 115 and the drain 116 may include a bottom layer of molybdenum titanium alloy as a conductive material and a top layer of copper as a conductive material. A thickness of the source 115 is same as that of the drain 116, and each of them is 2000 Å-8000 Å, such as 2000 Å, 3000 Å, 4000 Å, 5000 Å, 6000 Å, 7000 Å, or 8000 Å, etc.

In this embodiment, the repair electrode 13 is connected to the source 115. In a direction parallel to the plane in which the substrate 10 is located, with respect to two adjacent subpixels 1, the repair electrode 13 of one subpixel 1 extends from one end of the source 115 of the one subpixel 1 toward the anode 12 of the other subpixel 1. Here, in the direction parallel to the plane in which the substrate 10 is located, with respect to two adjacent subpixels 1, an extending direction of the repair electrode 13 of one subpixel 1 is opposite to an extending direction of the anode 12 of the other subpixel 1 adjacent to the one subpixel 1.

The planarization layer 40 is disposed on a side of the source layer 115 away from the interlayer insulating layer 30. A via hole 401 is formed in the planarization layer 40. The source 115 is exposed by the via hole 401. In particular, a material of the planarization layer 40 may be of an inorganic material, which may include one or more of silicon nitride, silicon oxide, and silicon oxynitride. Alternatively, the material of the planarization layer 40 may be of an organic material, which may include an organic resin such as an epoxy resin, an acrylic resin, or the like. A thickness of the planarization layer 40 may be 1000 Å-5000 Å, such as 1000 Å, 1500 Å, 2000 Å, 2500 Å, 3000 Å, 3500 Å, 4000 Å, 4500 Å, or 5000 Å, etc.

The anode 12 is disposed on a side of the planarization layer 40 away from the source 115. The anode 12 extends into the via hole 401 and is connected to the source 115. The anode 12 may be in the form of a single-layer structure, a double-layer structure, or a three-layer structure. A material of the anode 12 may include one or more of ITO, IZO, Ag, Pd, Cu, Al, Ni, and La. For example, the anode 12 may be in the form of a three-layer structure of ITO/Ag/ITO.

In this embodiment, with respect to two adjacent subpixels 1, an orthographic projection of the repair electrode 13 of one subpixel 1 on the substrate 10 partially overlaps with an orthographic projection of the anode 12 of the other subpixel 1 on the substrate 10, and the repair electrode 13 of the one subpixel 1 is insulated from the anode 12 of the other subpixel 1. In particular, the anode 12 has an extension 121. In a direction parallel to the plane in which the substrate 10 is located, with respect to two adjacent subpixels 1, the extension 121 of one subpixel 1 extends toward the repair electrode 13 of the other subpixel 1, and is located in the repair region 1B of the other subpixel 1, and an orthographic projection of the extension 121 of one subpixel 1 on the substrate 10 overlaps with the orthographic projection of the repair electrode 13 of the other subpixel 1 on the substrate 10.

When a dark spot subpixel is present in the display panel 100, the repair electrode 13 in the dark spot subpixel may be welded by laser irradiation to connect to an adjacent extension 121 of an adjacent normal subpixel in the repair region 1B of the dark spot subpixel, so that the dark spot subpixel can be driven to emit light by the normal subpixel, so as to repair the dark spot subpixel to a normal subpixel, thereby improving a manufacturing yield of the display panel 100 and further improving a display quality of the display panel 100.

Further, in this embodiment, light emitted by adjacent two subpixels 1 in each column has a same color. In the above-described arrangement, if a dark spot subpixel is present in the display panel 100, the repair electrode 13 in the dark spot subpixel may be welded to the extension 121 of the anode 12 of an adjacent normal subpixel emitting light of the same color. In this case, the display effect of the repaired display panel 100 is not affected under a normal display condition, thereby ensuring the display quality of the display panel 100 while repairing the dark spot subpixel. In some embodiments, light emitted by adjacent two subpixels 1 in each row may be configured to have a same color. The description of this embodiment is not intended to be construed as a limitation to present disclosure.

It should be noted that, in some embodiments, two adjacent subpixels 1 in each column may also be subpixels 1 emitting light of different colors, and details are not described herein.

It should be noted that, in this embodiment, the display panel 100 further includes a light-emitting layer, a cathode, and an encapsulation layer (not shown). The related technologies are all related to the prior art, and are not described herein again.

Figure 3:
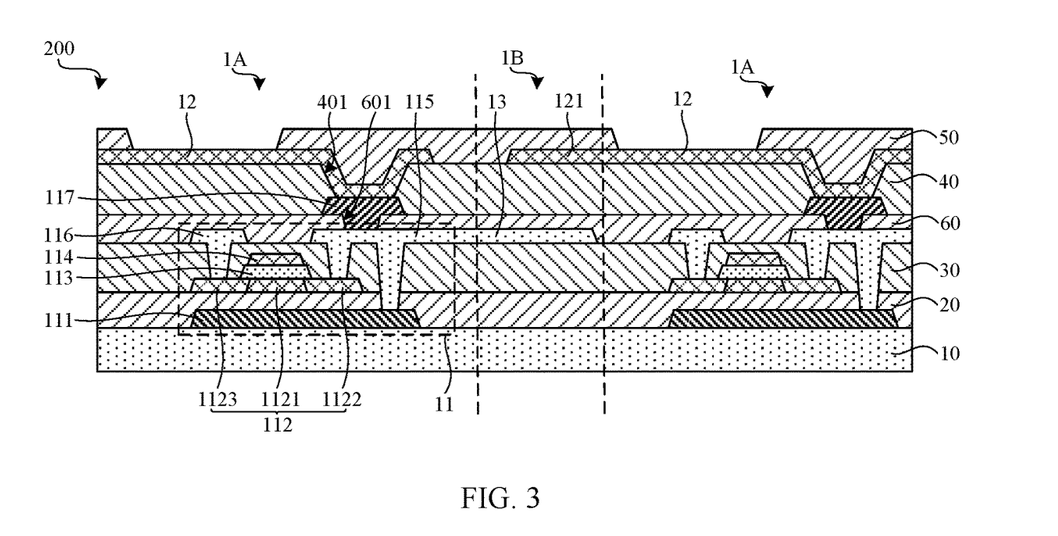
FIG. 3 is a second structural schematic view taken along section line O-O' of the display panel shown in FIG. 1.

Referring to FIG. 3, a second embodiment of the present disclosure provides a display panel 200. The display panel 200 according to the second embodiment of the present disclosure differs from the first embodiment in that the display panel 200 further includes a passivation layer 60 and a protection electrode 117. The passivation layer 60 is disposed on a side of the source 115 away from the interlayer insulating layer 30, and the protection electrode 117 is disposed between the passivation layer 60 and the planarization layer 40, and is located in the light-emitting area 1A. A contact hole 601 communicating with the via hole 401 is formed in the passivation layer 60. The protection electrode 117 is connected to the source 115 through the contact hole 601, and the anode 12 is connected to the protection electrode 117 through the via hole 401.

In particular, the source 115 is exposed by the contact hole 601. The protection electrode 117 extends into the contact hole 601 and is connected to the source 115. The protection electrode 117 is exposed by the via hole 401, and the anode 12 extends into the via hole 401 and is connected to the protection electrode 117. An orthographic projection of the protection electrode 117 on the plane in which the substrate 10 is located is within an orthographic projection of the source 115 on the plane in which the substrate 10 is located. A material of the protection electrode 117 may include one or more of molybdenum, titanium, and indium tin oxide.

In this embodiment, by providing the protective electrode 117 on a surface of the source 115 in contact with the anode 12, it is possible to protect the source 115 from oxidation of the metal material in the source 115, thereby improving the signal transmission stability of the source 115 and improving the driving performance of the thin film transistor 11.

Figure 4:
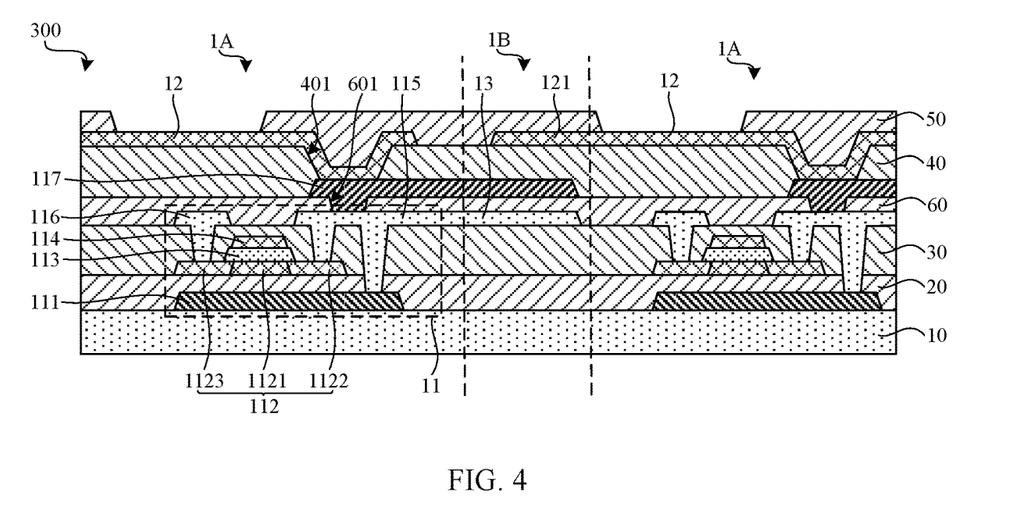
FIG. 4 is a third structural schematic view taken along section line O-O' of the display panel shown in FIG. 1.

Referring to FIG. 4, a third embodiment of the present disclosure provides a display panel 300. The display panel 300 according to the third embodiment of the present disclosure differs from the second embodiment in that the orthographic projection of the protection electrode 117 on the plane in which the substrate 10 is located at least partially overlaps with the orthographic projection of the repair electrode 13 on the plane in which the substrate 10 is located.

In particular, the protection electrode 117 extends from the light-emitting area 1A to the repair region 1B, and the passivation layer 60 is disposed between a portion of the protection electrode 117 in the repair region 1B and the repair electrode 13.

Since the protection electrode 117 is a conductive electrode, a thickness of conductive layers from the repair electrode 13 to the extension portion 121 is increased by extending the protection electrode 117 up to a position above the repair electrode 13 in this embodiment, so that the welding probability of the repair electrode 13 and the anode 12 can be increased during a process for repairing the dark spot in the display panel 300. Further, since the protection electrode 117 and the repair electrode 13 are electrically connected through the source 115, the above-described arrangement does not affect a normal repair of the dark spot subpixel.

In this embodiment, in the repair region 1B of the subpixel 1, the orthographic projection of the protection electrode 117 on the plane in which the substrate 10 is located completely overlaps with the orthographic projection of the repair electrode 13 on the plane in which the substrate 10, to further improve the welding probability of the repair electrode 117 and the extension 121 of the anode 12.

Figure 5:
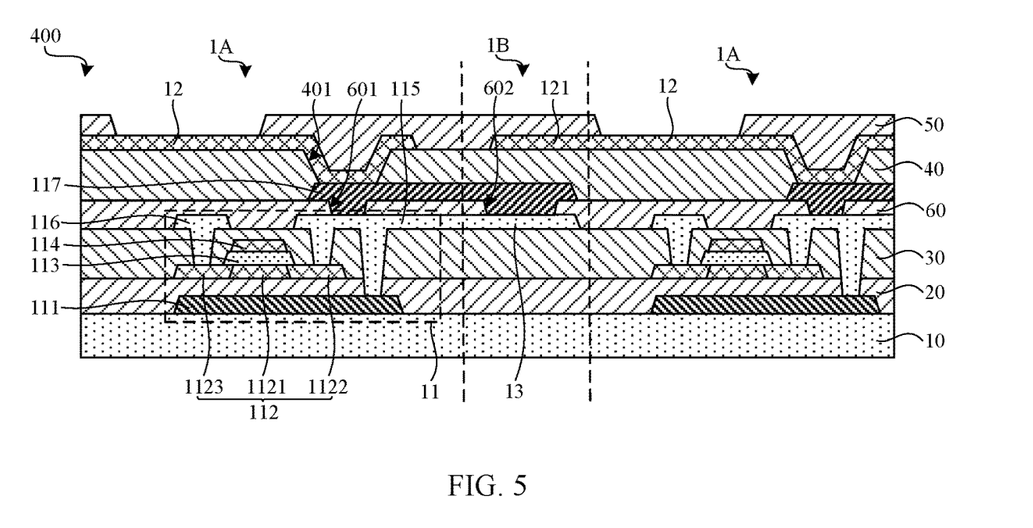
FIG. 5 is a fourth structural schematic view taken along section line O-O' of the display panel shown in FIG. 1.

Referring to FIG. 5, a fourth embodiment of the present disclosure provides a display panel 400. The display panel 400 according to the fourth embodiment of the present disclosure differs from the third embodiment in that a connection hole 602 spaced apart from the contact hole 601 is further disposed in the passivation layer 60, the connection hole 602 is located in an overlapping area of the orthographic projection of the protection electrode 117 on the substrate 10 and the orthographic projection of the repair electrode 13 on the substrate 10, and the protection electrode 117 is connected to the repair electrode 13 through the connection hole 602.

In particular, the connection hole 602 is located in the repair region 1B, the repair electrode 13 is exposed by the connection hole 602. The protection electrode 117 extends into the connection hole 602 and is connected to the repair electrode 13. The above-described arrangement further increases a thickness of conductive layers in the repair region 1B, and further increases the welding probability of the repair electrode 13 and the extension 121 in the dark spot repair process of the display panel 400, thereby improving the probability of successfully repairing the dark spot of the display panel 400.

Figure 6:
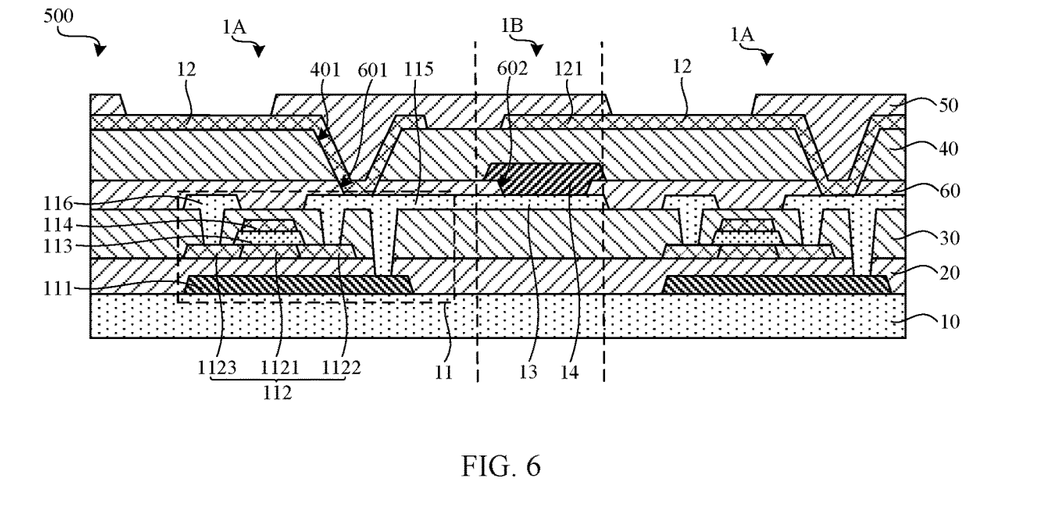
FIG. 6 is a fifth structural schematic view taken along section line O-O' of the display panel shown in FIG. 1.

Referring to FIG. 6, a fifth embodiment of the present disclosure provides a display panel 500. The display panel 500 according to the fifth embodiment of the present disclosure differs from the first embodiment in that the display panel 500 further includes a passivation layer 60 and an auxiliary repair electrode 14. The passivation layer 60 is disposed on a side of the source 115 away from the interlayer insulating layer 30, and the auxiliary repair electrode 14 is disposed between the passivation layer 60 and the planarization layer 40 and located in the repair region 1B. a contact hole 601 and a connection hole 602 spaced apart from each other are formed in the passivation layer 60. The contact hole 601 is connected to the via hole 401, and the anode 12 is connected to the source 115 sequentially through the via hole 401 and the contact hole 601. The auxiliary repair electrode 14 is connected to the repair electrode 13 through the connection hole 602. An orthographic projection of the auxiliary repair electrode 14 on the plane in which the substrate 10 is located at least partially overlaps with the orthographic projection of the repair electrode 13 on the plane in which the substrate 10 is located.

The repair electrode 13 is exposed by the connection hole 602. The auxiliary repair electrode 14 extends into the connection hole 602 and is connected to the repair electrode 13.

In this embodiment, the auxiliary repair electrode 14 is disposed in the repair region 1B of the subpixel 1, and the auxiliary repair electrode 14 is located above the repair electrode 13 and connected to the repair electrode 13. With respect to two adjacent subpixels 1, the repair electrode 13 of one subpixel 1 and the extension 121 of the other subpixel 1 is spaced apart with only one planarization layer 40 therebetween. That is, a thickness of an insulating layer between the repair electrode 13 of the one subpixel 1 and the extension 121 of the other subpixel 1 is reduced. Thus, in the dark spot repair process of the display panel 500, the reduction in the thickness of the insulating layer may increase the welding probability of the repair electrode 13 and the extension 121, so that the probability of successfully repairing the dark spot of the display panel 500 can be greatly improved.

Figure 7:
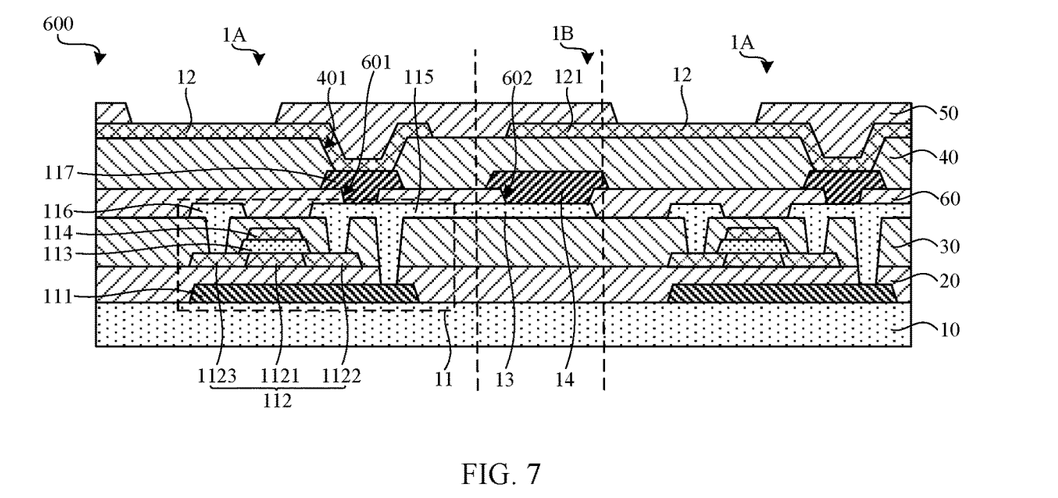
FIG. 7 is a sixth structural schematic view taken along section line O-O' of the display panel shown in FIG. 1.

Referring to FIG. 7, a sixth embodiment of the present disclosure provides a display panel 600. The display panel 600 according to the fifth embodiment of the present disclosure differs from the second embodiment in that the display panel 600 further includes an auxiliary repair electrode 14. The auxiliary repair electrode 14 and the protection electrode 117 are arranged in the same layer and spaced apart from each other. The auxiliary repair electrode 14 is located in the repair region 1B. An orthographic projection of the auxiliary repair electrode 14 on the substrate 10 at least partially overlaps with the orthographic projection of the repair electrode 13 on the substrate 10. A connection hole 602 spaced apart from the contact hole 601 is further disposed in the passivation layer 60. The auxiliary repair electrode 14 is connected to the repair electrode 13 through the connection hole 602.

In particular, the repair electrode 13 is exposed by the connection hole 602. The auxiliary repair electrode 14 extends into the connection hole 602 and is connected to the repair electrode 13.

In this embodiment, the auxiliary repair electrode 14 is disposed in the repair region 1B of the subpixel 1, and the auxiliary repair electrode 14 is located above the repair electrode 13 and connected to the repair electrode 13. With respect to two adjacent subpixels 1, the repair electrode 13 of one subpixel 1 and the extension 121 of the other subpixel 1 is spaced apart with only one planarization layer 40 therebetween. That is, a thickness of an insulating layer between the repair electrode 13 of the one subpixel 1 and the extension 121 of the other subpixel 1 is reduced. Thus, in the dark spot repair process of the display panel 600, the reduction in the thickness of the insulating layer may increase the welding probability of the repair electrode 13 and the extension 121, so that the probability of successfully repairing the dark spot of the display panel 600 can be greatly improved.

In particular, the auxiliary repair electrode 14 is arranged in the same layer as the protection electrode 117. That is, they can be manufactured by a same mask. Therefore, the arrangement of the auxiliary repair electrode 14 in this embodiment does not increase the process cost.

The orthographic projection of the auxiliary repair electrode 14 on the substrate 10 completely overlaps with the orthographic projection of the repair electrode 13 on the substrate 10 located. This arrangement may further increase a repair region of the repair region 1B in which the dark spot subpixel is located, thereby facilitating the improvement of the probability of successfully repairing the dark spot of the display panel 600.

Figure 8:
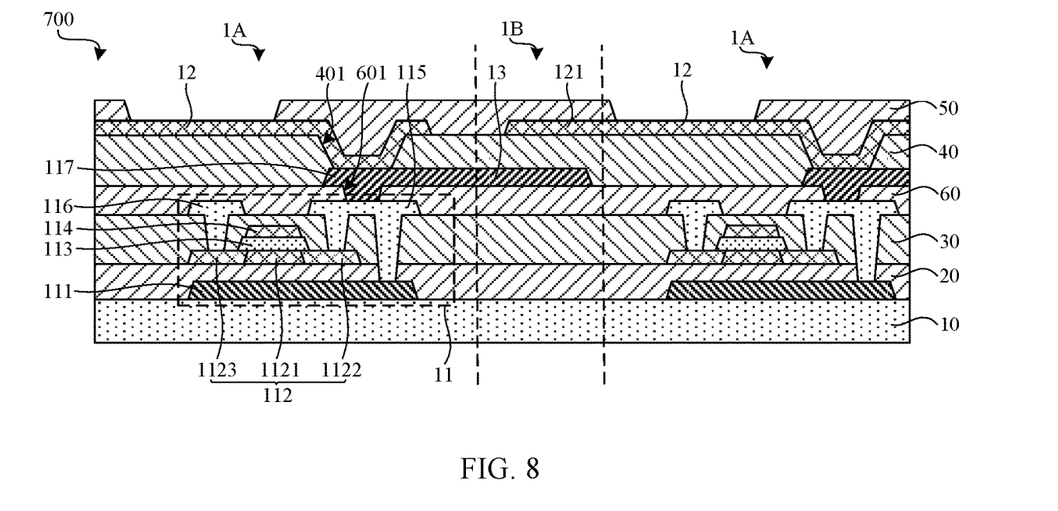
FIG. 8 is a seventh structural schematic view taken along section line O-O' of the display panel shown in FIG. 1.

Referring to FIG. 8, a seventh embodiment of the present disclosure provides a display panel 700. The display panel 700 according to the seventh embodiment of the present disclosure differs from the first embodiment in that the display panel 700 further includes a passivation layer 60 and a protection electrode 117. The passivation layer 60 is disposed on a side of the source 115 away from the interlayer insulating layer 30. The protection electrode 117 is disposed between the passivation layer 60 and the planarization layer 40, and is located in the light-emitting area 1A. A contact hole 601 communicating with the via hole 401 is formed in the passivation layer 60. The protection electrode 117 is connected to the source 115 through the contact hole 601, and the anode 12 is connected to the protection electrode 117 through the via hole 401. With respect to two adjacent subpixels 1, the repair electrode 13 of one subpixel 1 is disposed in the same layer as the protection electrode 117 and one end of the protection electrode 117 extends toward the extension portion 121 of the other subpixel 1.

In particular, the source 115 is exposed by the contact hole 601. The protection electrode 117 extends into the contact hole 601 and is connected to the source 115. The protection electrode 117 is exposed by the via hole 401. The anode 12 extends into the via hole 401 and is connected to the protection electrode 117. A material of the protection electrode 117 may include one or more of molybdenum, titanium, and indium tin oxide.

In this embodiment, by providing the protective electrode 117 on a surface of the source 115 in contact with the anode 12, it is possible to protect the source 115 from oxidation of the metal material in the source 115, thereby improving the signal transmission stability of the source 115 and improving the driving performance of the thin film transistor 11.

Figure 9:
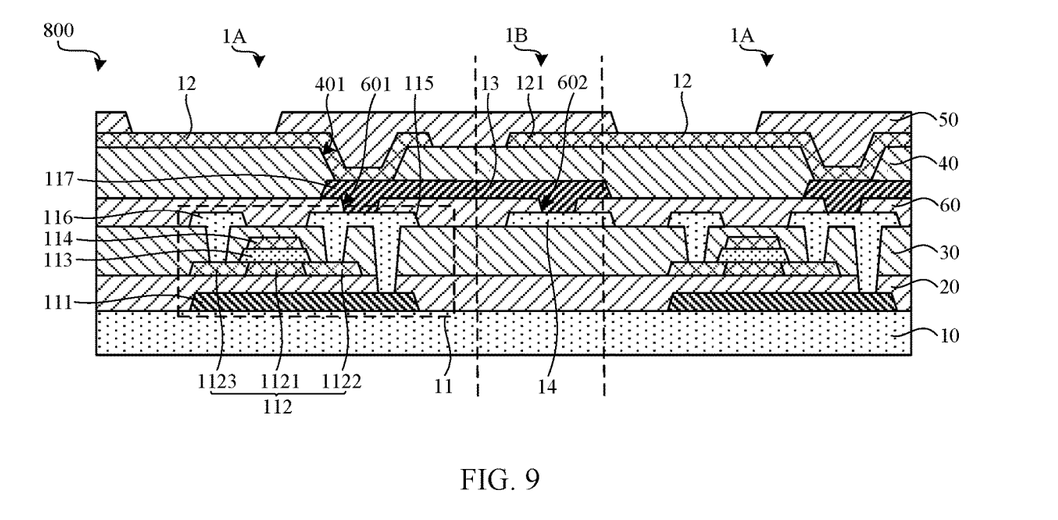
FIG. 9 is an eighth structural schematic view taken along section line O-O' of the display panel shown in FIG. 1.

Referring to FIG. 9, an eighth embodiment of the present disclosure provides a display panel 800. The display panel 800 according to the eighth embodiment of the present disclosure differs from that the seventh embodiment in that the display panel 800 further includes an auxiliary repair electrode 14. The auxiliary repair electrode 14 and the source 115 are arranged in a same layer and spaced apart from each other. The auxiliary repair electrode 14 is located in the repair region 1B. An orthographic projection of the auxiliary repair electrode 14 on the plane in which the substrate 10 is located at least partially overlaps with the orthographic projection of the auxiliary repair electrode 13 on the plane in which the substrate 10 is located. A connection hole 602 spaced apart from the contact hole 601 is disposed in the passivation layer 60. The auxiliary repair electrode 14 is connected to the auxiliary repair electrode 13 thought the connection hole 602.

In particular, the auxiliary repair electrode 14 is exposed by the connection hole 602. The repair electrode 13 extends into the connection hole 602 and is connected to the auxiliary repair electrode 14.

In this embodiment, the auxiliary repair electrode 14 is disposed in the repair region 1B of the subpixel 1, and the auxiliary repair electrode 14 is located below the repair electrode 13 and connected to the repair electrode 13, which increases a thickness of conductive layers in the repair region 1B, and increases the welding probability of the repair electrode 13 and the extension portion 121, thereby further improving the success rate of the dark spot repair of the display panel 800.

In particular, the auxiliary repair electrode 14 is arranged in the same layer as the source 115. That is, they can be manufactured by a same mask. Therefore, the arrangement of the auxiliary repair electrode 14 in this embodiment does not increase the process cost.

The orthographic projection of the auxiliary repair electrode 14 on the substrate 10 completely overlaps with the orthographic projection of the repair electrode 13 on the substrate 10 located. This arrangement may further increase a repair area of the repair region 1B in which the dark spot subpixel is located, thereby facilitating the improvement of the success rate of the dark spot repair of the display panel 800.

The present disclosure further provides a method for repairing a display panel according to any of the foregoing embodiments, the method includes the following steps:

detecting whether there is a dark spot subpixel in a plurality of subpixels; and if there is the dark spot subpixel, welding a repair electrode in the dark spot subpixel to an anode in an adjacent normal subpixel.

In particular, taking the display panel 700 according to the seventh embodiment for an example, and with reference to FIG. 8, the method for repairing the dark spot in the display panel 700 includes the following steps:

detecting whether there is the dark spot subpixel in the display panel 700 at a light-on test process of the display panel 700; and if there is the dark spot subpixel, welding the repair electrode 13 in the dark spot subpixel to the extension 121 of the anode 12 in the adjacent normal subpixel.

In particular, the repair region 1B of the dark spot subpixel is laser-irradiated by using the laser irradiation process, so that the repair electrode 13 in the dark spot subpixel is welded to the anode 12 of the adjacent normal subpixel. Since the repair electrode 13 is connected to the anode 12 through the protection electrode 117 in the dark spot subpixel, when a voltage is supplied to the anode 12 of the normal subpixel, the voltage supplied to the anode 12 of the normal subpixel is transmitted to the anode 12 of the dark spot subpixel sequentially through the repair electrode 13 and the protection electrode 117, and thus the dark spot subpixel may be driven to emit light. Therefore, the dark spot subpixel is repaired as a normal subpixel.

It should be noted that, for a method for repairing the display panel according to other foregoing embodiments, when a dark spot subpixel is present in the display panel, the method for repairing the dark spot subpixel may be described with reference to this embodiment, and details are not described herein again.

Further, the present disclosure further provides a display panel, the display panel including a plurality of subpixels, each subpixel including an active layer, a source, an anode, and a repair electrode disposed on a substrate; the source disposed between the active layer and the anode, the repair electrode connected to the source and located on a side of the active layer close to the anode, wherein with respect to two adjacent subpixels, an orthographic projection of the repair electrode of one subpixel on the substrate partially overlaps with an orthographic projection of the anode of the other subpixel on the substrate, and the repair electrode of the one subpixel is connected to the anode of the other subpixel.

It should be noted that, the above-descried display panel is a structure in which a dark spot subpixel present in the display panel has been repaired. Next, the structure of the repaired display panel provided in present disclosure will be described in detail with reference to the structure of the repaired display panel in response to the dark spot subpixel present in the display panel in the seventh embodiment as an example.

Figure 10:
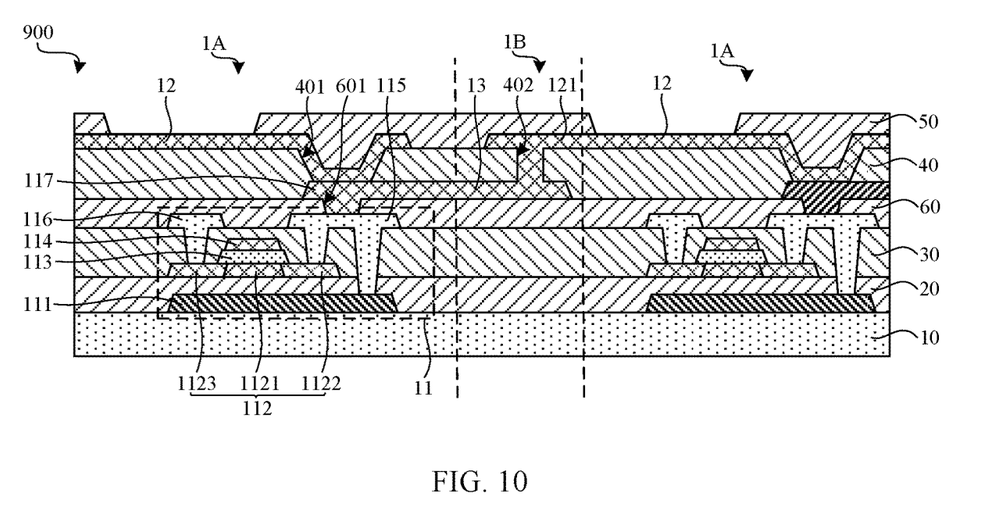
FIG. 10 is a structural schematic view of the repaired display panel according to the present disclosure.

Referring to FIG. 10, a ninth embodiment of the present disclosure provides a display panel 900. The display panel 900 according to the ninth embodiment of the present disclosure differs from the seventh embodiment in that with respect to two adjacent subpixels 1 emitting light of a same color, the repair electrode 13 of one subpixel 1 is connected to the extension portion 121 of the other subpixel 1.

In particular, a repair hole 402 is formed in the planarization layer 40. The repair hole 402 is located in the repair region 1B, and the extension portion 121 extends into the repair hole 402 and is connected to the repair electrode 13.

It should be noted that, in other embodiments described above, when the dark spot subpixel is present in the display panel, the structure after repairing the dark spot subpixel may be descried with reference to this embodiment, and details are not described herein again.

The present disclosure also provides a display device such as a mobile phone, a tablet, a notebook computer, a television, or the like. The display device includes a housing and a display panel disposed in the housing, the display panel may be any one of those described according to any of the foregoing embodiments, and a specific structure of the display panel may be described with reference to the foregoing embodiments, and details are not described herein again.

A display panel, a method for repairing the display panel, and a display device provided in embodiments of the present disclosure are described in detail above. The principles and embodiments of the present disclosure are described herein in any of specific embodiments. The above description of embodiments of the present disclosure is merely intended to help understand the methods and core ideas of the present disclosure. Meanwhile, for those skilled in the art, in accordance with the ideas of the present disclosure, there will be changes in the specific embodiments and the scope. In summary, the content of the present specification should not be construed as limiting the present disclosure.

What is claimed is:

1. A display panel, wherein the display panel comprises a plurality of subpixels, and each of the plurality of subpixels comprises an active layer, a source, an anode, and a repair electrode disposed on a substrate, wherein the source is located between the active layer and the anode, and the repair electrode is connected to the source and located on a side of the active layer close to the anode; and wherein with respect to two adjacent subpixels, an orthographic projection of the repair electrode of one subpixel of the two adjacent subpixels on the substrate partially overlaps with an orthographic projection of the anode of the other subpixel of the two adjacent subpixels on the substrate, wherein the anode has an extension portion, and wherein in a direction parallel to a plane in which the substrate is located, with respect to the two adjacent subpixels, the repair electrode of the one subpixel extends toward the extension portion of the other subpixel, the extension portion of the other subpixel extends toward the repair electrode of the one subpixel, and the orthographic projection of the repair electrode of the one subpixel on the substrate partially overlaps with an orthographic projection of the extension portion of the other subpixel on the substrate, wherein with respect to the two adjacent subpixels, the repair electrode of the one subpixel is disposed in the same layer as the source, and extends from one end of the source toward the extending portion of the other subpixel, wherein the display panel further comprises a passivation layer, a protection electrode, and a planarization layer sequentially disposed between the source and the anode, and wherein a contact hole is formed in the passivation layer, the protection electrode is connected to the source through the contact hole, a via hole communicating with the contact hole is formed in the planarization layer, and the anode is connected to the protection electrode through the via hole; and wherein an orthographic projection of the protection electrode on the plane in which the substrate is located at least partially overlaps with the orthographic projection of the repair electrode on the plane in which the substrate is located.

2. The display panel according to claim 1, wherein a connection hole spaced apart from the contact hole is further disposed in the passivation layer, the connection hole is located in an overlapping area of the orthographic projection of the protection electrode on the substrate and the orthographic projection of the repair electrode on the substrate, and the protection electrode is connected to the repair electrode through the connection hole.

3. A display panel, wherein the display panel comprises a plurality of subpixels, and each of the plurality of subpixels comprises an active layer, a source, an anode, and a repair electrode disposed on a substrate, wherein the source is located between the active layer and the anode, and the repair electrode is connected to the source and located on a side of the active layer close to the anode; and wherein with respect to two adjacent subpixels, an orthographic projection of the repair electrode of one subpixel of the two adjacent subpixels on the substrate partially overlaps with an orthographic projection of the anode of the other subpixel of the two adjacent subpixels on the substrate, wherein the anode has an extension portion, and wherein in a direction parallel to a plane in which the substrate is located, with respect to the two adjacent subpixels, the repair electrode of the one subpixel extends toward the extension portion of the other subpixel, the extension portion of the other subpixel extends toward the repair electrode of the one subpixel, and the orthographic projection of the repair electrode of the one subpixel on the substrate partially overlaps with an orthographic projection of the extension portion of the other subpixel on the substrate, wherein with respect to the two adjacent subpixels, the repair electrode of the one subpixel is disposed in the same layer as the source, and extends from one end of the source toward the extending portion of the other subpixel, and wherein the display panel further comprises a passivation layer, an auxiliary repair electrode, and a planarization layer sequentially disposed between the source and the anode, and wherein an orthographic projection of the auxiliary repair electrode on the plane in which the substrate is located at least partially overlaps with the orthographic projection of the repair electrode on the plane in which the substrate is located, a connection hole is formed in the passivation layer, and the auxiliary repair electrode is connected to the repair electrode through the connection hole.

4. The display panel according to claim 3, wherein the display panel further comprises a protection electrode disposed between the passivation layer and the planarization layer, a contact hole spaced apart from the connection hole is further formed in the passivation layer, the protection electrode is connected to the source through the contact hole, a via hole communicating with the contact hole is formed in the planarization layer, and the anode is connected to the protection electrode through the via hole; and wherein the auxiliary repair electrode is arranged in the same layer as the protection electrode and spaced apart from the protection electrode.

5. A display panel, wherein the display panel comprises a plurality of subpixels, and each of the plurality of subpixels comprises an active layer, a source, an anode, and a repair electrode disposed on a substrate, wherein the source is located between the active layer and the anode, and the repair electrode is connected to the source and located on a side of the active layer close to the anode; and wherein with respect to two adjacent subpixels, an orthographic projection of the repair electrode of one subpixel of the two adjacent subpixels on the substrate partially overlaps with an orthographic projection of the anode of the other subpixel of the two adjacent subpixels on the substrate, wherein the anode has an extension portion, and wherein in a direction parallel to a plane in which the substrate is located, with respect to the two adjacent subpixels, the repair electrode of the one subpixel extends toward the extension portion of the other subpixel, the extension portion of the other subpixel extends toward the repair electrode of the one subpixel, and the orthographic projection of the repair electrode of the one subpixel on the substrate partially overlaps with an orthographic projection of the extension portion of the other subpixel on the substrate, wherein the display panel further comprises a passivation layer, a protection electrode, and a planarization layer sequentially disposed between the source and the anode, wherein a contact hole is formed in the passivation layer, the protection electrode is connected to the source through the contact hole, a via hole communicating with the contact hole is formed in the planarization layer, and the anode is connected to the protection electrode through the via hole; and wherein with respect to the two adjacent subpixels, the repair electrode of the one subpixel is disposed in the same layer as the protection electrode and extends from one end of the protection electrode toward the extending portion of the other subpixel.

6. The display panel according to claim 5, wherein the display panel further comprises an auxiliary repair electrode, the auxiliary repair electrode is arranged in the same layer as the source and spaced apart from the source, an orthographic projection of the auxiliary repair electrode on the plane in which the substrate is located at least partially overlaps with the orthographic projection of the repair electrode on the plane in which the substrate is located, a connection hole spaced apart from the contact hole is formed in the passivation layer, and the auxiliary repair electrode is connected to the repair electrode through the connection hole.

7. The display panel according to claim 1, wherein light emitting by the two adjacent subpixels has a same color.

8. A method of repairing the display panel according to claim 1, comprising the following steps:

detecting whether there is a dark spot subpixel in the plurality of subpixels, and if there is the dark spot subpixel, the repair electrode in the dark spot subpixel is welded to the extension of the anode in an adjacent normal subpixel.

9. The display panel according to claim 1, the repair electrode of the one subpixel is insulated from the anode of the other subpixel.

10. The display panel according to claim 1, the repair electrode of the one subpixel is connected to the anode of the other subpixel.

11. The display panel according to claim 3, the repair electrode of the one subpixel is insulated from the anode of the other subpixel.

12. The display panel according to claim 3, the repair electrode of the one subpixel is connected to the anode of the other subpixel.

13. The display panel according to claim 3, wherein light emitting by the two adjacent subpixels has a same color.

14. A method of repairing the display panel according to claim 3, comprising the following steps:

detecting whether there is a dark spot subpixel in the plurality of subpixels, and if there is the dark spot subpixel, the repair electrode in the dark spot subpixel is welded to the extension of the anode in an adjacent normal subpixel.

15. The display panel according to claim 5, the repair electrode of the one subpixel is insulated from the anode of the other subpixel.

16. The display panel according to claim 5, the repair electrode of the one subpixel is connected to the anode of the other subpixel.

17. The display panel according to claim 5, wherein light emitting by the two adjacent subpixels has a same color.

18. A method of repairing the display panel according to claim 5, comprising the following steps:

detecting whether there is a dark spot subpixel in the plurality of subpixels, and if there is the dark spot subpixel, the repair electrode in the dark spot subpixel is welded to the extension of the anode in an adjacent normal subpixel.

* * * * *